United States Patent
Hartsock et al.

(10) Patent No.: US 11,501,035 B2
(45) Date of Patent: Nov. 15, 2022

(54) VERIFICATION OF ROBOTIC ASSETS UTILIZED IN A PRODUCTION WORK CELL

(71) Applicant: The Boeing Company, Chicago, IL (US)

(72) Inventors: Kenneth A. Hartsock, Marysville, WA (US); Robert M. Irwin, Woodinville, WA (US)

(73) Assignee: The Boeing Company, Chicago, IL (US)

( * ) Notice: Subject to any disclaimer, the term of this patent is extended or adjusted under 35 U.S.C. 154(b) by 869 days.

(21) Appl. No.: 16/122,955

(22) Filed: Sep. 6, 2018

(65) Prior Publication Data

US 2020/0082033 A1    Mar. 12, 2020

(51) Int. Cl.
*B25J 9/16* (2006.01)
*G06F 30/20* (2020.01)

(52) U.S. Cl.
CPC ............ *G06F 30/20* (2020.01); *B25J 9/1671* (2013.01)

(58) Field of Classification Search
CPC ................ G06F 30/20; B25J 9/1671
USPC ............................................. 703/7
See application file for complete search history.

(56) References Cited

U.S. PATENT DOCUMENTS

| | | | |
|---|---|---|---|
| 8,768,651 B2 * | 7/2014 | Bhaskaran ............... | G06F 30/00 703/1 |
| 10,058,995 B1 * | 8/2018 | Sampedro ................ | B25J 9/163 |
| 2014/0180644 A1 * | 6/2014 | Maturana ............... | G05B 19/05 703/1 |
| 2020/0306978 A1 * | 10/2020 | Riek .......................... | B25J 9/08 |
| 2020/0320233 A1 * | 10/2020 | Naderhirn ............... | G06F 30/20 |

OTHER PUBLICATIONS

Kraft, Martin, and Markus Rickert. "How to teach your robot in 5 minutes: Applying UX paradigms to human-robot-interaction." 2017 26th IEEE International Symposium on Robot and Human Interactive Communication (RO-MAN). IEEE, 2017. pp. 942-949. (Year: 2017).*
Chen, I-Ming. "Rapid response manufacturing through a rapidly reconfigurable robotic workcell." Robotics and Computer-Integrated Manufacturing 17.3 (2001). pp. 199-213. (Year: 2001).*
Larsen, Lars, et al. "Collision-free path planning of industrial cooperating robots for aircraft fuselage production." 2015 IEEE International Conference on Robotics and Automation (ICRA). IEEE, 2015. pp. 2042-2047. (Year: 2015).*
Baizid, Khelifa, et al. "IRoSim: Industrial Robotics Simulation Design Planning and Optimization platform based on CAD and knowledgeware technologies." Robotics and Computer-Integrated Manufacturing 42 (2016). pp. 121-134. (Year: 2016).*

* cited by examiner

*Primary Examiner* — John E Johansen
(74) *Attorney, Agent, or Firm* — Duft & Bornsen, PC

(57) ABSTRACT

Embodiments described herein provide verification of robotic assets for a production work cell via simulation. A production workflow for the production work cell is received from a user, and a simulation is generated based on the production workflow. The simulation of the work cell controller design is executed using performance data for the robotic assets, and a determination is made whether the robotic assets meet or exceed the design requirements of the robotic assets based on the simulation. The result of the determination is presented to the user.

20 Claims, 6 Drawing Sheets

SIDE

FRONT

VERIFICATION OF ROBOTIC ASSETS UTILIZED IN A PRODUCTION WORK CELL

FIELD

This disclosure relates to the field of manufacturing and, in particular, to robots that fabricate aircraft.

BACKGROUND

Building an aircraft may include attaching skin panels to a support structure that provides structural rigidity. For example, the support structure may include hoop-wise frames and longitudinal elongated stringers, to which skin panels are attached. Together, the combination of skin panels and support structure defines a portion of the airframe of the aircraft.

Fastening operations and/or other work may be performed to join the skin panels and the support members together to form the airframe. These operations may include, for example, drilling operations, riveting operations, interference-fit bolting operations, inspection, etc.

Within a manufacturing environment, (e.g., a factory floor, a production work cell on the factory floor, etc.) robots may be utilized to perform the operations described above for forming the airframe for an aircraft. The robots may be placed onto mobile platforms that move around the production work cells where the airframe is built. Each work cell on the factory floor may include a cell controller that coordinates the activities performed by the robots operating in their respective production work cell. The robots are programmed with complex functions that perform the fabrication steps on the aircraft in the production work cell. Further, different production work cells on the factory floor may perform different subsets of the complete fabrication process for an aircraft. Therefore, each cell controller and the robots associated with a cell have programming and coordination activities which differ between production work cells.

Generally, the robots and/or the programs that control the robots in a given production work cell are designed well in advance of the intended start date of fabricating a new type of aircraft. In many cases, it is difficult or impossible to fully test out the robots and/or their programs prior to production. Often, such robots and/or their programs fail to meet their design requirements during the initial phases of a new production, which then requires the robots and/or their programs to be modified during production to enable the design specifications to be met. Further, in some cases the design specifications are subjective, which makes determining if design specifications have been met difficult. This type of verification/debug activity during production can be inefficient and time consuming. Further, when the design of the robots and/or their programs are contracted out to a third party, it may be difficult to determine if the design specifications for the robots and/or their programs have been met by the third party prior to accepting delivery of the contracted items.

Therefore, there is a need to determine whether the robotic assets for a production work cell do and/or will operate as specified by their design requirements to ensure that the production process for a new type of aircraft is able to be performed without undue delay and/or debugging of the robotic assets.

SUMMARY

Embodiments described herein provide verification of robotic assets for a production work cell via simulation. A production workflow for the production work cell is received from a user, and a simulation is generated based on the production workflow. The simulation of the work cell controller design is executed using performance data for the robotic assets, and a determination is made whether the robotic assets meet or exceed the design requirements of the robotic assets based on the simulation. The result of the determination is presented to the user.

One embodiment comprises a simulator for a production work cell. The simulator includes a display device and a controller. The display device displays a Graphical User Interface (GUI) to a user. The controller obtains design requirements for robotic assets used by the production work cell, receives a production workflow for the production work cell from the user via the GUI, and creates a simulation of the production work cell based on the production work flow. The controller obtains performance data for the robotic assets, executes the simulation using the performance data, and determines whether the robotic assets meet or exceed the design requirements based on the simulation. The controller displays the result of the determination to the user.

Another embodiment comprises a method of simulating a production work cell. The method comprises obtaining design requirements for robotic assets used by the production work cell, receiving a production workflow for the production work cell from a user, and creating a simulation of the production work cell based on the production workflow. The method further comprises obtaining performance data for the robotic assets, executing the simulation using the performance data, determining whether the robotic assets meet or exceed the design requirements based on the simulation, and displaying a result of the determination to the user.

Another embodiment comprises a non-transitory computer-readable medium embodying programmed instructions which, when executed by a processor, direct the processor to obtain design requirements for robotic assets used by the production work cell, receive a production workflow for the production work cell from a user, and create a simulation of the production work cell based on the production workflow. The instructions further direct the processor to obtain performance data for the robotic assets, execute the simulation using the performance data, determine whether the robotic assets meet or exceed the design requirements based on the simulation, and display a result of the determination to the user.

The features, functions, and advantages that have been discussed can be achieved independently in various embodiments or may be combined in yet other embodiments, further details of which can be seen with reference to the following description and drawings.

DESCRIPTION OF THE DRAWINGS

Some embodiments are now described, by way of example only, and with reference to the accompanying drawings. The same reference number represents the same element or the same type of element on all drawings.

DETAILED DESCRIPTION

The figures and the following description illustrate specific exemplary embodiments. It will be appreciated that those skilled in the art will be able to devise various arrangements that, although not explicitly described or shown herein, embody the principles described herein and are included within the contemplated scope of the claims that follow this description. Furthermore, any examples described herein are intended to aid in understanding the principles of the disclosure are to be construed as being without limitation. As a result, this disclosure is not limited to the specific embodiments or examples described below, but by the claims and their equivalents.

Figure 1:
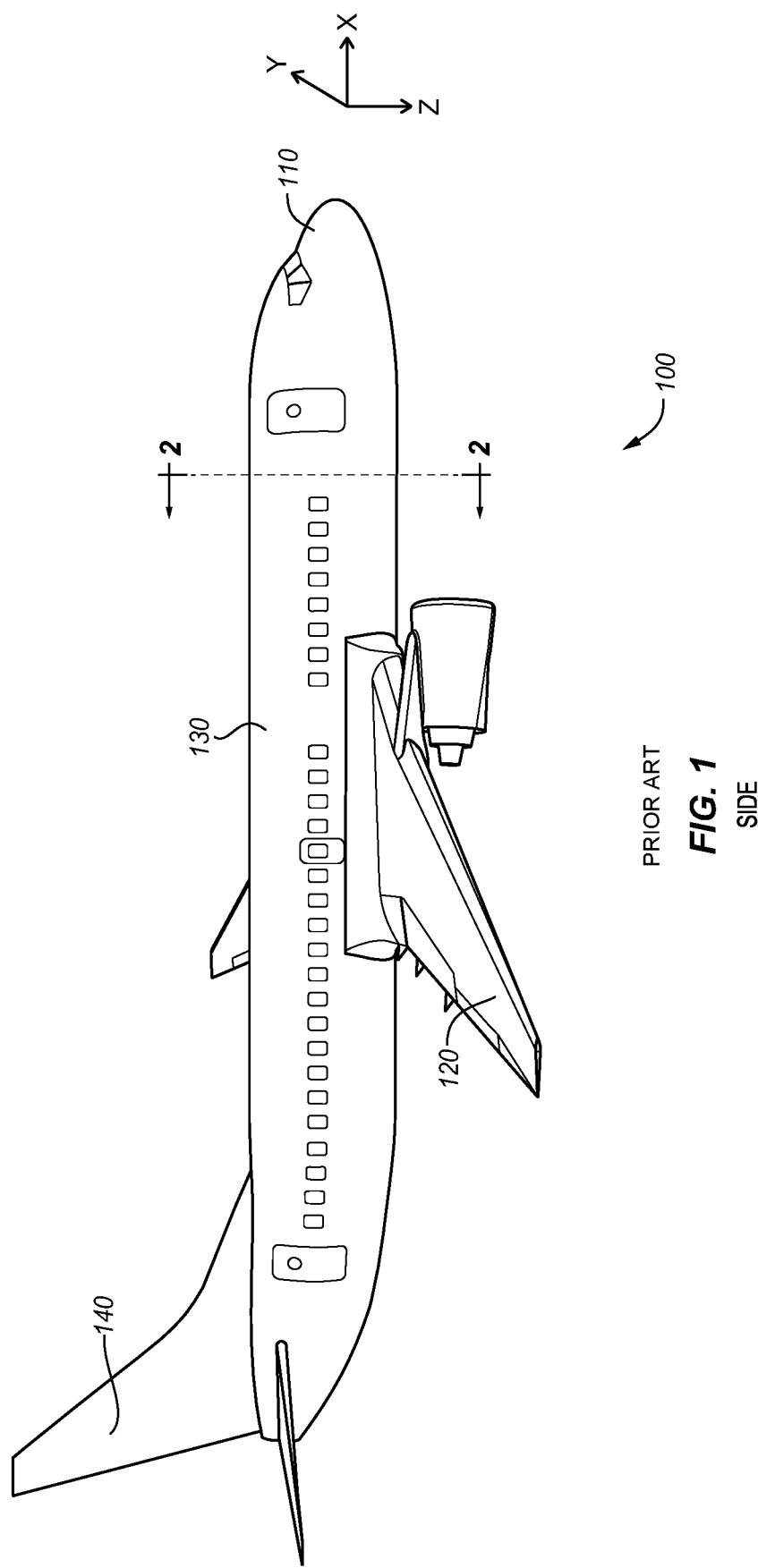
FIG. 1 depicts a side view of an aircraft in an illustrative embodiment.

FIG. 1 depicts a side view of an aircraft 100 in an illustrative embodiment. Aircraft 100 includes nose 110, wings 120, fuselage 130, and tail 140. FIG. 1 also illustrates a downward direction (Z) for aircraft 100. Although aircraft 100 has been depicted to have a particular configuration for purposes of discussion, aircraft 100 may have other configurations in other embodiments.

Figure 2:
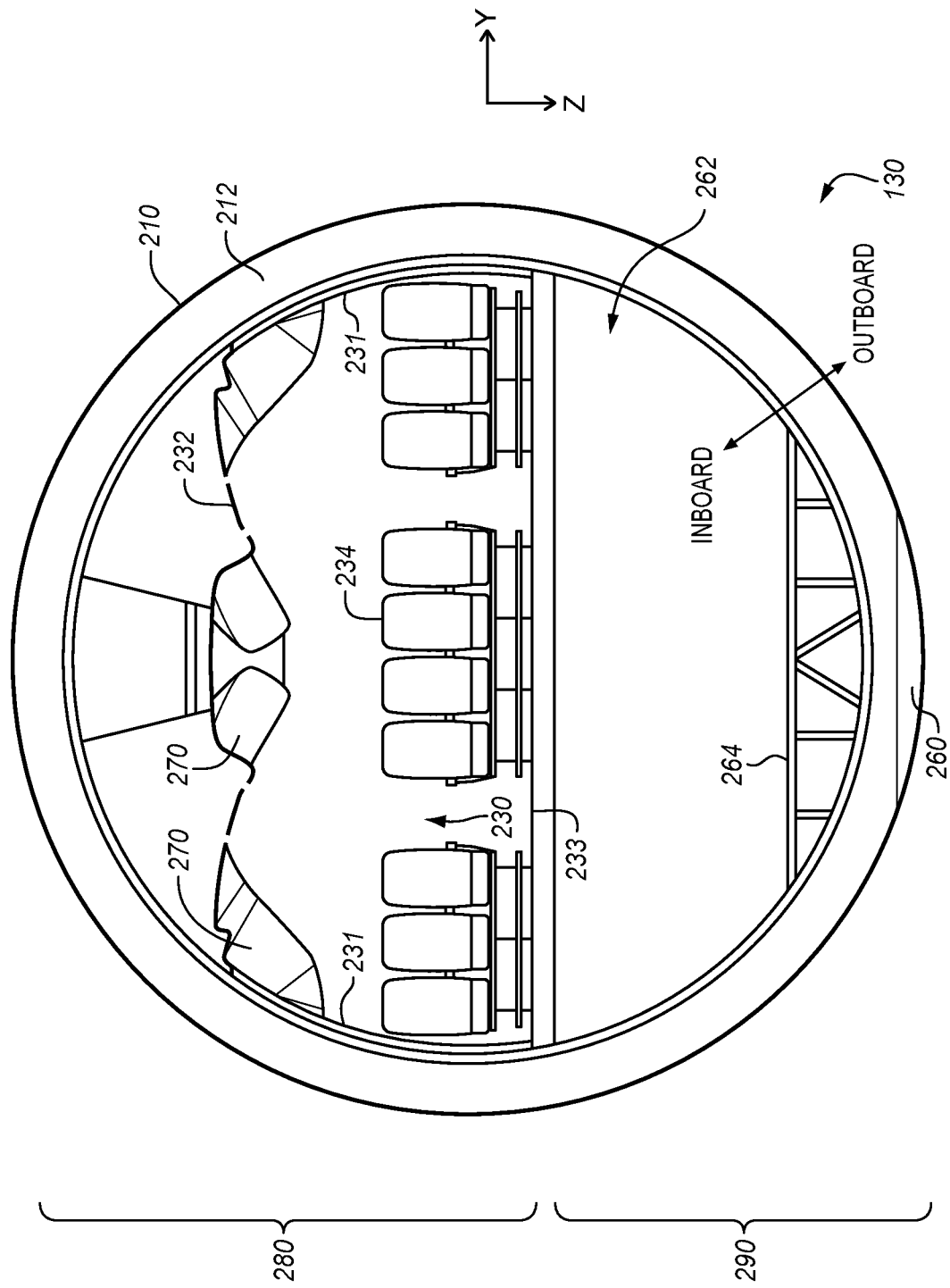
FIG. 2 depicts a cut-through front view of the aircraft corresponding to view arrows 2 in FIG. 1 in an illustrative embodiment.

FIG. 2 depicts a cut-through front view of aircraft 100 corresponding to view arrows 2 in FIG. 1 in an illustrative embodiment. In particular, FIG. 2 illustrates a cross sectional view of fuselage 130 for aircraft 100. Fuselage 130 includes an upper section 280, which includes a floor 233, a ceiling 232, and sidewalls 231 that form a cabin 230. Support members 212 (e.g., comprising hoopwise frames and longitudinally elongated stringers) enforce the shape of fuselage 130 and provide structural support. In this embodiment, seating 234 and storage 270 are also included. Fuselage 130 also includes a lower section 290, which includes drainage 260 located beneath cargo floor 264 of cargo area 262. FIG. 2 further illustrates that an outboard direction that proceeds towards an external surface (e.g., skin 210) of aircraft 100, and an inboard direction that proceeds towards the interior (e.g., cabin 230) of aircraft 100. As shown in FIG. 2, skin 210 surrounds fuselage 130.

Figure 3:
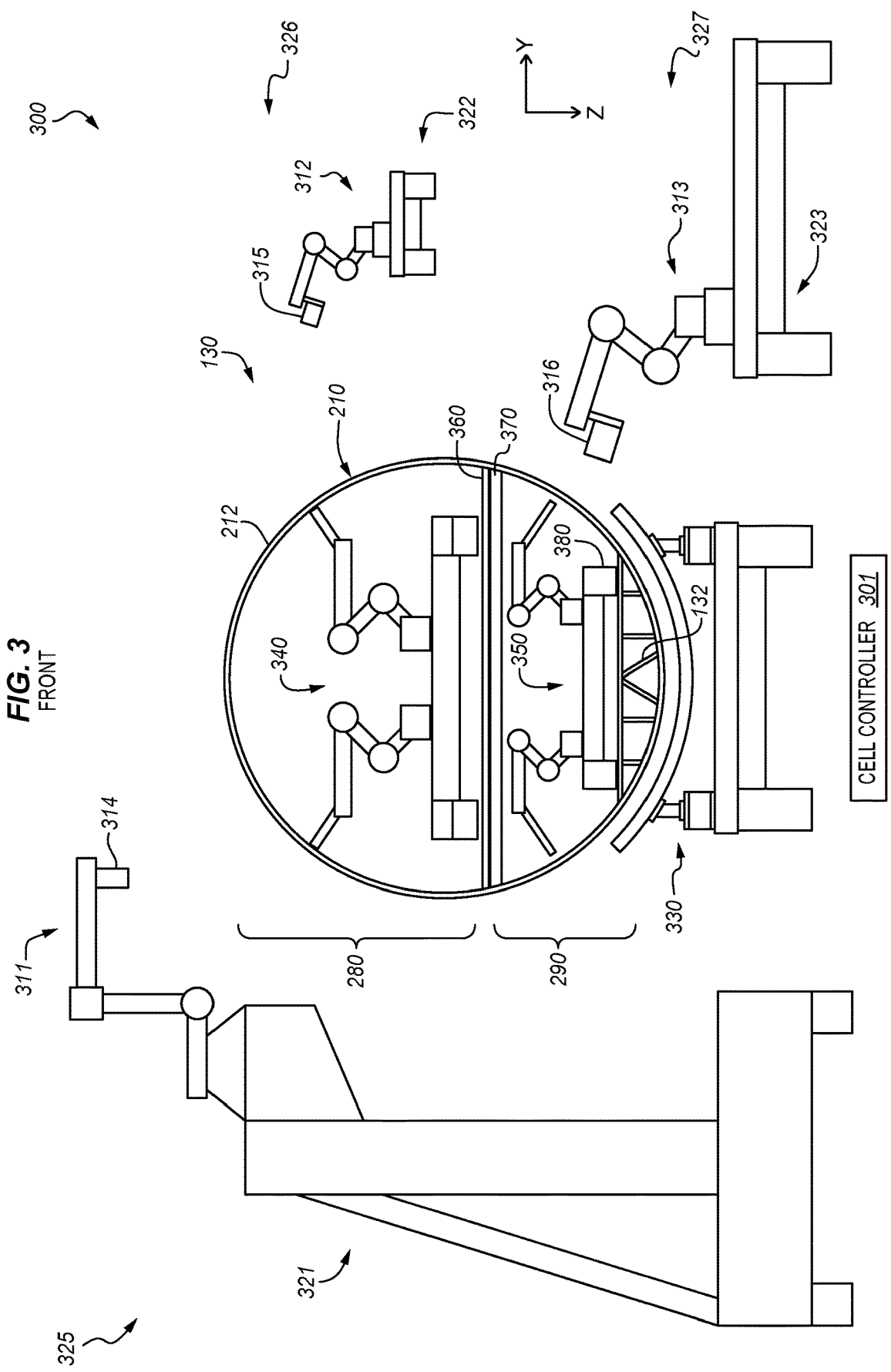
FIG. 3 is a front view of a manufacturing environment for a portion of a fuselage in an illustrative embodiment.

FIG. 3 is a front view of a production work cell 300 for a portion of fuselage 130 in an illustrative embodiment. That is, FIG. 3 illustrates the same view of fuselage 130 as FIG. 2, but represents the environment in which fuselage 130 is fabricated. Hence, the differences between fuselage 130 in FIG. 2 and FIG. 3 are the result of the fabrication of fuselage 130 being completed in FIG. 2, and yet still in progress in FIG. 3. Although production work cell 300 is described with respect to fabricating fuselage 130, the discussion of production work cell 300 equally applies to fabricating other portions of aircraft 100, such as nose 110, wings 120, tail 140, etc.

Production work cell 300 comprises any system operable to utilize automated processing by robots to assemble support members 212 of fuselage 130 and skin 210 together in order to form an airframe for aircraft 100. In this embodiment, production work cell 300 includes fuselage 130, which is mounted onto cradle 330. Production work cell 300 further includes robotic assets 325-327. Robotic assets 325-327 include robotic devices 311-313, respectively, which are mounted to mobile robotic platforms 321-323, respectively.

Robotic devices 311-313 include end effectors 314-316, respectively, which are used during the fabrication process for fuselage 130. Any number of tools may be associated with end effectors 314-316. The tools associated with end effectors 314-316 may include, for example, drilling tools, fastener insertion tools, fastener installation tools, inspection tools, etc. Further, the tools associated with end effectors 314-316 may be exchanged with other tools located on their respective mobile robotic platform 321-323 to perform different operations (e.g., utilizing a plurality of tools stored by tool lockers found on their respective mobile robotic platform 321-323).

Robotic assets 325-327 may traverse fuselage 130 as desired in order to perform work on fuselage 130. Robotic devices 311-313 and mobile robotic platforms 321-323 coordinate their actions with mobile tracked robot assemblies 340 and 350 within fuselage 130, in order to engage in fabrication operations that assemble fuselage 130 and/or affix skin 210 to support members 212 of fuselage 130. Robot assembly 340 performs work within upper section 280 of fuselage 130, while robot assembly 350 performs work within lower section 290 of fuselage 130. Furthermore, robot assembly 340 moves across a temporary floor 360 in upper section 280, which is mounted to joists 370. Robot assembly 350 moves across temporary floor 380 in lower section 290, which is mounted to structure 132.

During the manufacturing process, mobile robotic platforms 321-323 and robotic devices 311-313 move autonomously to perform the steps used to fabricate fuselage 130 under direction of a cell controller 301. That is, cell controller 301 utilizes a program or workflow to coordinate the activities of robotic assets 325-327 during the fabrication process. Further, mobile robotic platforms 321-323 and/or robotic devices 311-313 may each include their own programming that is used control how mobile robotic platforms 321-323 and robotic devices 311-313 operate during the fabrication process, respectively.

Figure 4:
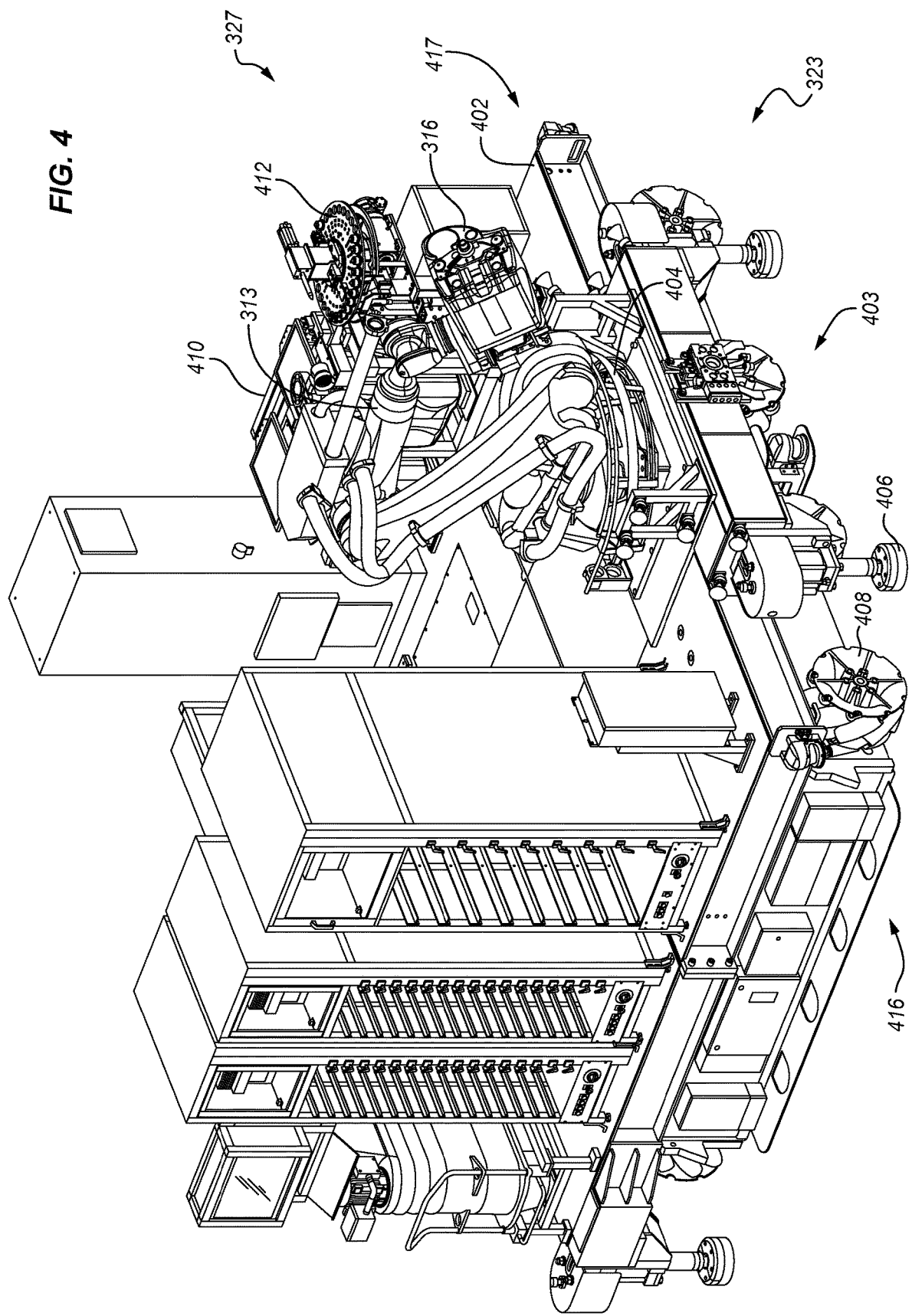
FIG. 4 is a perspective view of a robotic asset in an illustrative embodiment.

FIG. 4 is a perspective view of robotic asset 327 in an illustrative embodiment. In this embodiment, mobile robotic platform 323 of robotic asset 327 includes a platform base 402, with robotic device 313 mounted to platform base 402 utilizing a movement system 404. In this embodiment, robotic device 313 is located proximate to a front 403 of mobile robotic platform 323, and centered between sides 416-417 of mobile robotic platform 323. Movement system 404 is configured to allow robotic device 313 to rotate. In this embodiment, robotic device 313 is located proximate to a front 403 of mobile robotic platform 323, although in other embodiments, robotic device 313 may be positioned differently on platform base 402. Mobile robotic platform 323 in this embodiment further includes hydraulic legs 406 that can be lowered towards the factory floor to provide stability to mobile robotic platform 323. Mobile robotic platform 323 further includes a plurality of omnidirectional wheels 408 which enable mobile robotic platform 323 to traverse within a work cell and perform a fabrication process on fuselage 130.

An end effector storage system 410 is located on mobile robotic platform 323, which is used to store different types of end effectors that may be utilized by robotic device 311 during the fabrication of fuselage 130. A tool magazine station 412 that is onboard mobile robotic platform 323 is used to store different types of tools that may be used during the fabrication of fuselage 130.

As discussed previously, fabricating a new type of aircraft may entail designing new types of robots and/or at the very least, specifying and designing the programs that control the robots. In some cases, the robots and/or the programming for the robots is specified well in advance of the start of production for a new type of aircraft. Further, in some cases the work in building and testing the robots and/or the work in creating and testing the programming for the robots is contracted to parties other than the manufacturer of aircraft 100. Prior to beginning production, the robots and/or the programming for the robots is tested. However, due to the complexity of aircraft production, it may be difficult or impossible to determine if the robots are able to perform to their specifications prior to beginning work on producing a new type of aircraft. In this case, the production floor becomes a test bed for the robots, which is not very efficient. Further, due to the fact that complete testing of the robots is left to the actual production process for aircraft 100, such testing most likely will result in production delays, which are also not desirable.

In the embodiments described herein, a simulator for a production work cell (e.g., production work cell 300) is used to determine whether the robots used in the production work cell (e.g., robotic assets 325-327) meet or exceed their design requirements. This allows for the robots to be verified by simulation rather than during the production process. This also allows for the aircraft manufacturer to determine whether the robots and/or their programs have been designed correctly by the other parties, thereby limiting the risk of the aircraft manufacturer being tasked with correcting mistakes in the design and/or programming of the robots after their delivery from the contracted party.

Figure 5:
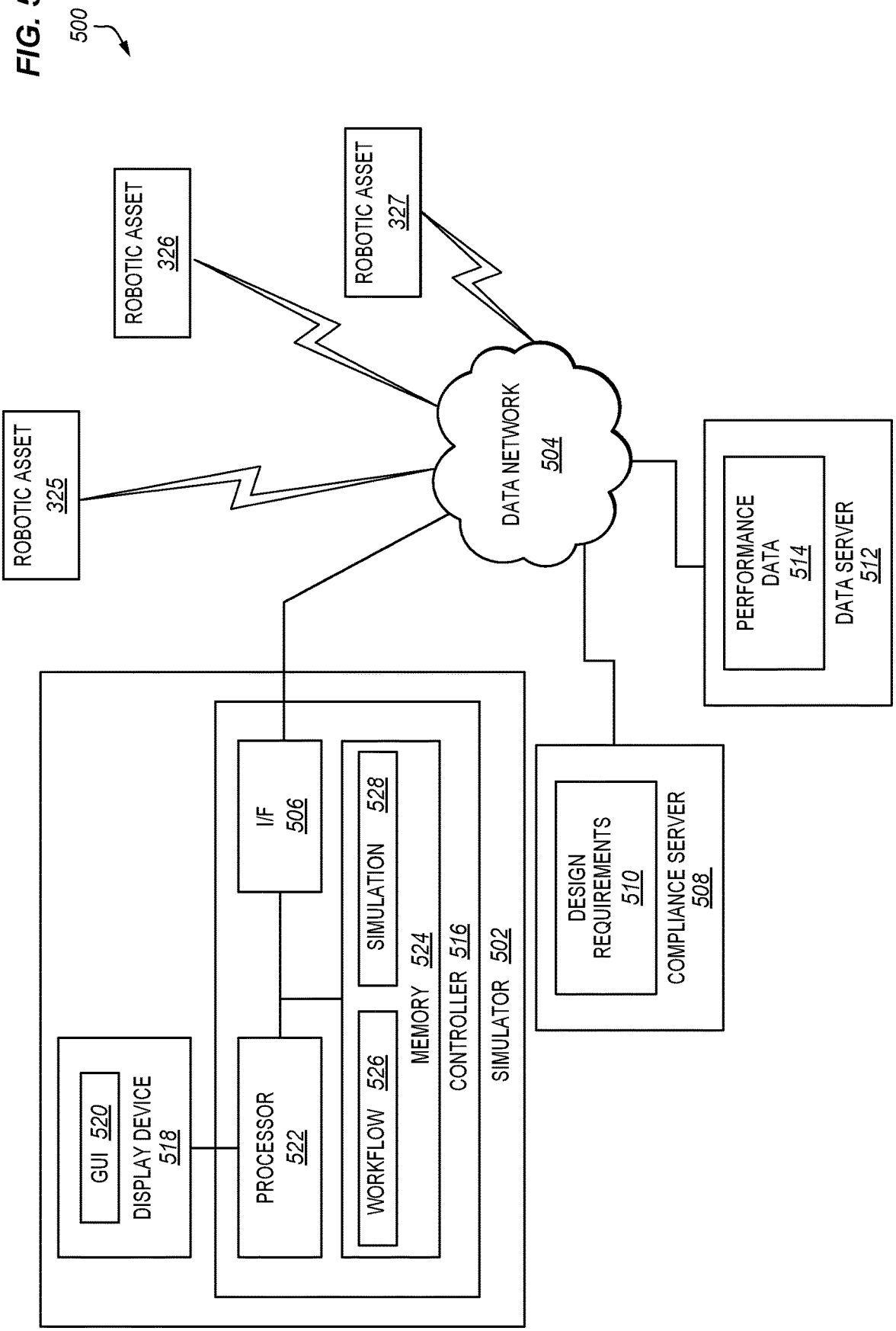
FIG. 5 is a block diagram of system for simulating a production work cell in an illustrative embodiment.

FIG. 5 is a block diagram of a system 500 for simulating a production work cell (e.g., production work cell 300) in an illustrative embodiment. In this embodiment, system 500 includes a simulator 502, which is communicatively coupled to a data network 504 via an interface (I/F) 506. Data network 504 may include any wired or wireless network as a matter of design choice. Some wired examples of I/F 506 used by simulator 502 to communicate with data network 504 include Ethernet, including Power over Ethernet (POE) implementations, Universal Serial Bus (USB), Fiber optic interfaces, etc. Some wireless examples of I/F 506 used by simulator 502 to communicate with data network 504 include IEEE 802.11, IEEE 802.15.4, Bluetooth, etc.

In this embodiment, system 500 further includes a compliance server 508, which is used to store design requirements 510 for robotic assets 325-327, and a data server 512, which is used to store performance data 514 for robotic assets 325-327.

Simulator 502 in this embodiment includes a controller 516, which is communicatively coupled to a display device 518. Display device 518 includes any component, system, or device that displays a Graphical User Interface (GUI) 520 to a user. For instance, display device 518 may include Liquid Crystal Displays with touch panel overlays, Organic LED displays with touch panel overlays, combinational devices with a display and a user interface, such as keyboards, mice, trackballs, etc.

While the specific hardware implementation of controller 516 is subject to design choices, one particular embodiment may include one or more processors 522 coupled with a memory 524. Processor 522 includes any hardware device that is able to perform functions. Processor 522 may include one or more Central Processing Units (CPU), microprocessors, Digital Signal Processors (DSPs), Application-specific Integrated Circuits (ASICs), etc. Some examples of processors include INTEL® CORE™ processors, Advanced Reduced Instruction Set Computing (RISC) Machines (ARM®) processors, etc.

Memory 524 includes any hardware device that is able to store data. For instance, memory 524 may store a production workflow 526 created by a user for simulating a production work cell (e.g., production work cell 300). Production workflow 526 may include various elements interconnected together that define how production work cell 300 operates. For instance, production workflow 526 may reference various data sources, robotic assets 325-327, data sinks, various control hardware for production work cell 300, etc. Memory 524 in this embodiment also stores a simulation 528, which is generated by simulator 502 based on production workflow 526.

Memory 524 may include one or more volatile or non-volatile Dynamic Random Access Memory (DRAM) devices, FLASH devices, volatile or non-volatile Static RAM devices, hard drives, Solid State Disks (SSDs), etc. Some examples of non-volatile DRAM and SRAM include battery-backed DRAM and battery-backed SRAM.

Figure 6:
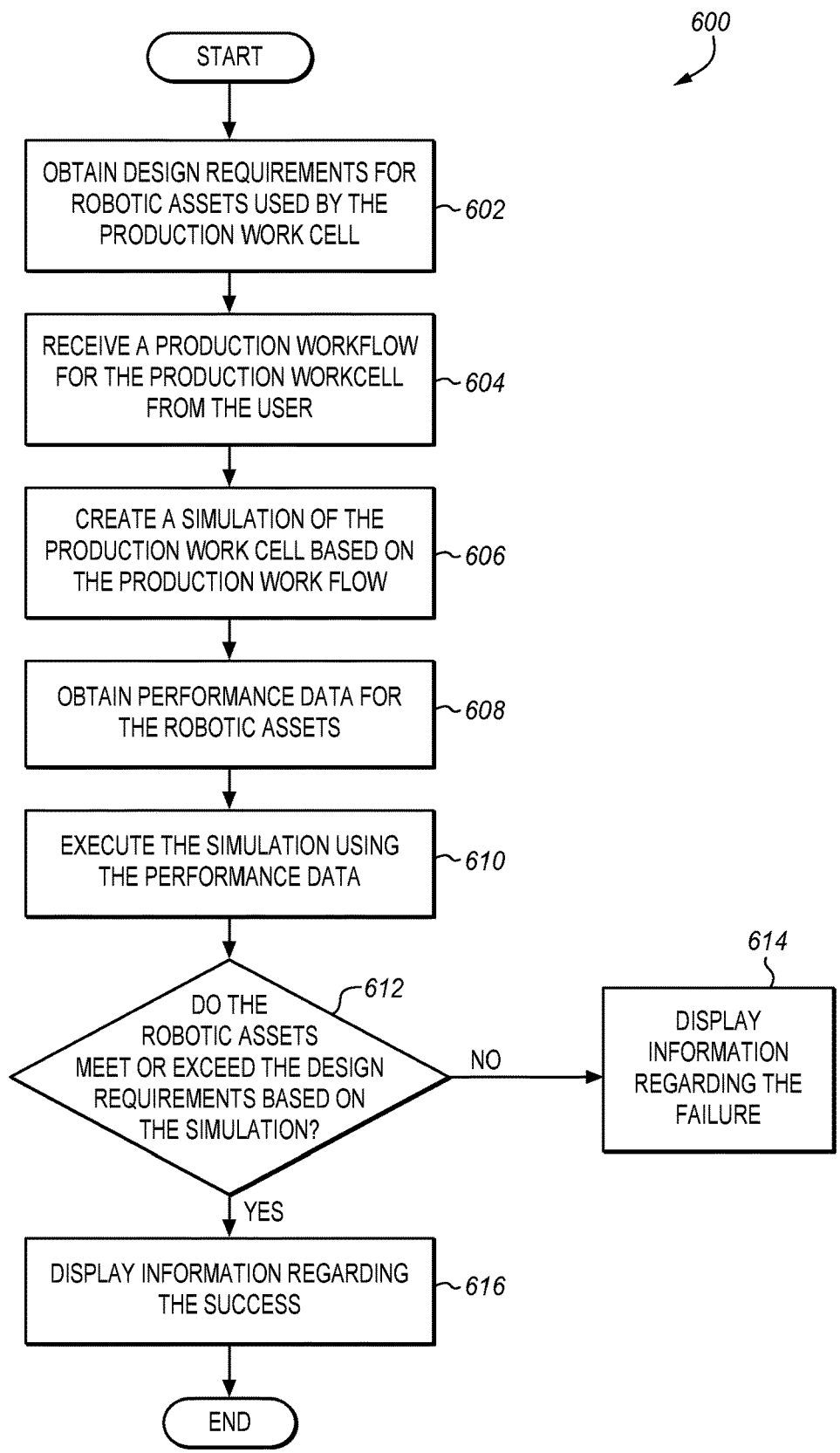
FIG. 6 is a flow chart of a method of simulating a production work cell in an illustrative embodiment.

FIG. 6 is a flow chart of a method 600 of simulating a production work cell in an illustrative embodiment. Method 600 will be described with respect to system 500 and production work cell 300, although method 600 may be performed by other systems and applied to other production work cells not explicitly described. The steps of method 600 are not all inclusive, and may include other steps, not explicitly described. Further, the steps of method 600 may be performed in an alternate order.

Consider that system 500 is operational and that a user desires to generate a simulation for production work cell 300. In particular, the user desires to determine whether robotic assets 325-327 meet or exceed design requirements 510 that have been defined for them.

Processor 522 obtains design requirements 510 for robotic assets 325-327 (see step 602). For instance, processor 522 may utilize I/F 506 to communicate with compliance server 508 utilizing data network 504 and retrieve design requirements 510 stored by compliance server 508.

Processor 522 receives production workflow 526 for production work cell 300 from the user (see step 604). For example, GUI 520 may be used by the user to create production workflow 526, which may include a number of interconnected functions that define how production work cell 300 operates. The options, conditions, and assets available to the user when creating production workflow 526 may be based on design requirements 510, which define the functions, features, and capabilities of robotic assets 325-327 and other elements of production workflow 526.

Based on production workflow 526, processor 522 creates simulation 528 of production work cell 300 (see step 606). That is, processor 522 may process production workflow 526 to convert the steps, inputs, outputs, data sources, data sinks, functions, etc., of production workflow 526 into elements of a defined simulation language.

Processor 522 obtains performance data 514 for robotic assets 325-327 (see step 608). Processor 522 may, for instance, utilize I/F 506 to communicate with data server 512 utilizing data network 504 and retrieve performance data 514 from data server 512. In some embodiments, performance data 514 comprises simulated data. For instance, generic data may be used as performance data 514 to quickly test the results of executing simulation 528. In another example, the simulated data used as performance data 514 may be generated by executing the programs in simulation that are used to control robotic assets 325-327. Executing the programs in simulation may be used to test the programs for robotic assets 325-327 in isolation.

In other embodiments, performance data 514 comprises live data feeds generated by robotic assets 325-327 during their operation in a real production work cell. For instance, robotic assets 325-327 may transmit their live data to data server 512 during operation utilizing wired or wireless interfaces to data network 504.

Processor 522 executes simulation 528 using performance data 514 (see step 610). While executing simulation 528, performance data 514 is used as a data source, thereby allowing simulation 528 to represent how robotic assets 325-327 will operate within production work cell 300.

Processor 522 determines whether robotic assets 325-327 meet or exceed their design requirements 510 based on simulation 528 (see step 612). For instance, any one of robotic assets 325-327 may fail one or more aspects of their respective part of design requirements 510, including but not limited to speed, accuracy, functionality, error reporting, error recovery, etc.

If one or more of robotic assets 325-327 fail, processor 522 utilizes GUI 520 to display this information to the user (see step 614). This information regarding a failure of one or more of robotic assets 325-327 with respect to design requirements 510 provides an indication to the user as to the scope and content of the failure. Using this information, correcting the failure can be performed, and method 600 may be performed again.

If robotic assets 325-327 meet or exceed their design requirements 510 based on simulation 528, then processor 522 utilizes GUI 520 to display this information to the user (see step 616). This information regarding the success of robotic assets 325-327 with respect to design requirements 510 allows the user to have some confidence that robotic assets 325-327 will perform correctly during actual production.

By verifying robotic assets 325-327 in simulation, lengthy debug and production delays can be avoided. Further, utilizing a simulation of production work cell 300 enables the aircraft manufacture to verify that robotic assets 325-327 have achieved their design goals prior to taking delivery of robotic assets 325-327 from a supplier. Further still, errors encountered during the simulation process can be used to quickly identify and correct errors, both in the physical performance characteristics of robotic assets 325-327 and their associated control programs.

Any of the various elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments were described herein, the scope is not limited to those specific embodiments. Rather, the scope is defined by the following claims and any equivalents thereof.

What is claimed is:

1. A simulator for a production work cell, the simulator comprising:
   a display device configured to display a Graphical User Interface (GUI) to a user;
   an interface communicatively coupled to a data server and a compliance server; and
   a processor configured to provide verification of robotic assets specified for the production work cell in advance of a start of production within the production work cell and prior to taking delivery of the robotic assets;
   wherein the robotic assets comprise robotic devices mounted to mobile robotic platforms, and each includes programming to control how the robotic devices and the mobile robotic platforms operate during a fabrication process;
   wherein a cell controller coordinates activities performed by the robotic devices and the mobile robotic platforms when operating in the production work cell to perform work on an airframe of an aircraft;
   wherein the processor, for the verification, is configured to obtain design requirements for the robotic assets from the compliance server, and to simulate the cell controller that uses a production workflow defined for the production work cell to coordinate the activities performed by the robotic devices and the mobile robotic platforms when operating in the production work cell according to their respective programming during the fabrication process to engage in fabrication operations that assemble the airframe of the aircraft; and
   wherein the processor is configured to simulate the cell controller by:
      receiving the production workflow for the production work cell that includes a number of interconnected functions that define how the production work cell operates;
      creating a simulation of the cell controller of the production work cell based on the production workflow;
      obtaining performance data for the robotic assets from the data server;
      executing the simulation of the cell controller using the performance data;
      determining whether the robotic assets meet or exceed the design requirements based on the simulation; and
      displaying a result of the determination to the user utilizing the GUI.

2. The simulator of claim 1, wherein:
   the performance data for the robotic assets comprises simulated data.

3. The simulator of claim 1, wherein:
   the performance data for the robotic assets comprises data generated by executing programs that control the robotic assets in simulation.

4. The simulator of claim 1, wherein:
   the production workflow references a data source for the production work cell; and
   the performance data is used as the data source referenced in the production workflow.

5. The simulator of claim 1, wherein:
the production workflow is configured to direct the robotic assets to simulate fabricating a portion of the aircraft.

6. The simulator of claim 1, wherein:
the production workflow is configured to direct the robotic assets to simulate fabricating a portion of a new type of aircraft.

7. The simulator of claim 1, wherein:
the processor is configured to provide an indication of a failure of at least one of the robotic assets utilizing the GUI.

8. A method of simulating a production work cell, the method comprising:
providing verification of robotic assets specified for the production work cell in advance of a start of production within the production work cell and prior to taking delivery of the robotic assets;
wherein the robotic assets comprise robotic devices mounted to mobile robotic platforms, and each includes programming to control how the robotic devices and the mobile robotic platforms operate during a fabrication process;
wherein a cell controller coordinates activities performed by the robotic devices and the mobile robotic platforms when operating in the production work cell to perform work on an airframe of an aircraft;
for the verification, the method further comprises obtaining design requirements for the robotic assets from the compliance server, and simulating the cell controller that uses a production workflow defined for the production work cell to coordinate the activities performed by the robotic devices and the mobile robotic platforms when operating in the production work cell according to their respective programming during the fabrication process to engage in fabrication operations that assemble the airframe of the aircraft;
wherein simulating the cell controller comprises:
receiving the production workflow for the production work cell that includes a number of interconnected functions that define how the production work cell operates;
creating a simulation of the cell controller of the production work cell based on the production workflow;
obtaining performance data for the robotic assets from a data server;
executing the simulation of the cell controller using the performance data;
determining whether the robotic assets meet or exceed the design requirements based on the simulation; and
displaying a result of the determination to the user utilizing a Graphical User Interface (GUI).

9. The method of claim 8, wherein obtaining the performance data comprises:
obtaining simulated performance data for the robotic assets.

10. The method of claim 8, wherein obtaining the performance data comprises:
executing programs that control the robotic assets in simulation to generate the performance data.

11. The method of claim 8, wherein:
the production workflow references a data source for the production work cell; and
the performance data is used as the data source referenced in the production workflow.

12. The method of claim 8, wherein:
the production workflow is configured to direct the robotic assets to simulate fabricating a portion of the aircraft.

13. The method of claim 8, wherein:
the production workflow is configured to direct the robotic assets to simulate fabricating a portion of a new type of aircraft.

14. The method of claim 8, wherein displaying a result of the determination to the user comprises:
providing an indication of a failure of at least one of the robotic assets utilizing the GUI.

15. A non-transitory computer-readable medium having programmed instructions which, when executed by a processor, direct the processor to implement a method of simulating a production work cell, the method comprising:
providing verification of robotic assets specified for the production work cell in advance of a start of production within the production work cell and prior to taking delivery of the robotic assets;
wherein the robotic assets comprise robotic devices mounted to mobile robotic platforms, and each includes programming to control how the robotic devices and the mobile robotic platforms operate during a fabrication process;
wherein a cell controller coordinates activities performed by the robotic devices and the mobile robotic platforms when operating in the production work cell to perform work on an airframe of an aircraft;
for the verification, the method further comprises obtaining design requirements for the robotic assets from the compliance server, and simulating the cell controller that uses a production workflow defined for the production work cell to coordinate the activities performed by the robotic devices and the mobile robotic platforms when operating in the production work cell according to their respective programming during the fabrication process to engage in fabrication operations that assemble the airframe of the aircraft;
wherein simulating the cell controller comprises:
receiving the production workflow for the production work cell that includes a number of interconnected functions that define how the production work cell operates;
creating a simulation of the cell controller of the production work cell based on the production workflow;
obtaining performance data for the robotic assets from a data server;
executing the simulation of the cell controller using the performance data;
determining whether the robotic assets meet or exceed the design requirements based on the simulation; and
displaying a result of the determination to the user utilizing a Graphical User Interface (GUI).

16. The non-transitory computer-readable medium of claim 15, wherein obtaining the performance data comprises:
obtaining simulated performance data for the robotic assets.

17. The non-transitory computer-readable medium of claim 15, wherein obtaining the performance data comprises:
executing programs that control the robotic assets in simulation to generate the performance data.

18. The non-transitory computer-readable medium of claim 15, wherein
the production workflow references a data source for the production work cell; and
the performance data is used as the data source referenced in the production workflow.

19. The non-transitory computer-readable medium of claim 15, wherein:
the production workflow is configured to direct the robotic assets to simulate fabricating a portion of the aircraft.

20. The non-transitory computer-readable medium of claim 15, wherein displaying a result of the determination to the user comprises:
providing an indication of a failure of at least one of the robotic assets utilizing the GUI.

* * * * *